United States Patent (10) Patent No.: US 10,888,010 B2
Geng et al. (45) Date of Patent: Jan. 5, 2021

(54) RETENTION OF DUAL IN-LINE MEMORY MODULES

(71) Applicant: Intel Corporation, Santa Clara, CA (US)

(72) Inventors: Phil Geng, Portland, OR (US); George Vergis, Portland, OR (US); Xiang Li, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/422,854

(22) Filed: May 24, 2019

(65) Prior Publication Data

US 2019/0281719 A1 Sep. 12, 2019

(51) Int. Cl.
| | |
|---|---|
| *H05K 7/12* | (2006.01) |
| *H05K 1/11* | (2006.01) |
| *H05K 7/10* | (2006.01) |
| *H05K 7/14* | (2006.01) |
| *H01R 12/73* | (2011.01) |

(52) U.S. Cl.
CPC ............ *H05K 7/12* (2013.01); *H05K 1/119* (2013.01); *H05K 7/10* (2013.01); *H05K 7/1488* (2013.01); *H01R 12/737* (2013.01); *H05K 1/117* (2013.01)

(58) Field of Classification Search
CPC ..................................................... H05K 5/00
See application file for complete search history.

(56) References Cited

U.S. PATENT DOCUMENTS

| | | | | |
|---|---|---|---|---|
| 10,147,464 | B1* | 12/2018 | Wen | G06F 1/26 |
| 2006/0050496 | A1* | 3/2006 | Goodwin | H05K 1/189 |
| | | | | 361/803 |
| 2013/0155599 | A1* | 6/2013 | Ross | G06F 1/187 |
| | | | | 361/679.31 |
| 2014/0211405 | A1* | 7/2014 | Yang | G06F 1/183 |
| | | | | 361/679.32 |
| 2018/0062287 | A1* | 3/2018 | Shaw | H01R 13/639 |
| 2018/0376611 | A1* | 12/2018 | Madanipour | H05K 7/20709 |

* cited by examiner

*Primary Examiner* — Jerry Wu
(74) *Attorney, Agent, or Firm* — Schwabe, Williamson & Wyatt, P.C.

(57) ABSTRACT

Embodiments are directed towards apparatuses, methods, and systems for a memory module, e.g., a dual in-line memory module (DIMM) including a first lengthwise edge along the DIMM and a second lengthwise edge, opposite the first lengthwise edge, to couple the DIMM with a printed circuit board (PCB). In embodiments, the DIMM includes one or more notches along the first lengthwise edge, to removeably couple with one or more flexible supports located at least partially along a length or width of a chassis and to engage the notches to assist in retention of the DIMM in the chassis to reduce a shock and/or vibration associated with a load of a plurality of DIMMs on the PCB. In some embodiments, the one or more flexible supports are coupled to a support structure, such as a pole mounted or otherwise coupled to a panel of the chassis. Additional embodiments may be described and claimed.

9 Claims, 6 Drawing Sheets

RETENTION OF DUAL IN-LINE MEMORY MODULES

FIELD

Embodiments of the present disclosure generally relate to the field of integrated circuits (IC), and more particularly, to dual-in-line memory modules (DIMMs).

BACKGROUND

In computer devices, a printed circuit board (PCB) may have a plurality of slots to receive a dual in-line memory module (DIMM). A DIMM is a small circuit board that includes a plurality of electrical components, such as for example, dynamic random access memory (DRAM) integrated circuits. Types of DIMMS include small circuit boards with, e.g., Synchronous DRAM (SDRAM) mounted on one or both sides of the DIMM and designed to synchronize with the timing of an externally supplied clock signal. Variants of DIMM slots may support various memory technologies. For example, the Joint Electron Device Engineering Council (JEDEC) promulgates various standards for semiconductor memory circuits and storage devices. JEDEC has promulgated standards for data rates of Double Data Rate (DDR) SDRAM. Additional versions of DIMMs include DDR2 SDRAM, DDR3 SDRAM, DDR4 SDRAM, DDR5 SDRAM, and successive versions of DDR SDRAMs. These memory units are mounted on the small circuit board and designed for use in platform devices, and/or including, e.g., personal computers, workstations, servers, and consumer products. The increase in amount of memory desired has increased the number of DIMMs on a platform. Increases in a count of DIMMs coupled to a PCB or motherboard, however, result in increases in the total DIMM mass weighing on the system. Thus, DIMM mechanical shock risk can be high at board and system level, especially during shipping and handling. Related problems include but are not limited to, motherboard deflection and DIMM latch connector failure.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments described include apparatuses, and systems including a memory module, e.g., a dual in-line memory module (DIMM), that includes one or more notches located along a first or top lengthwise edge of the DIMM to removeably couple with one or more supports to be located at least partially along a length or width of a housing such as a server or memory chassis ("chassis"). In embodiments, the supports are flexible and are to engage with the one or more notches to assist in retention of the DIMM to reduce a vibration and/or shock load of a plurality of DIMMs inserted into a connector on the motherboard in the chassis. In embodiments, the one or more flexible supports are coupled to a support structure, such as a pole, mounted or otherwise coupled, to a panel of the chassis, e.g., a top panel or a side panel. The DIMM, in embodiments, has a height greater than a height of a 1 U DIMM. Note that 1 U is a known measure and may correspond to 1 rack unit ("RU" or "U") unit of measure for a height of rack space; and 2 U, 3 U, 4 U, etc. and racks and corresponding equipment (e.g., rackmount servers) may be expressed in multiples of 1 U. For example, in some embodiments, the DIMM has a height that conforms to a 2 U server or memory chassis. Note that in embodiments, the one or more notches are to contact the one or more flexible supports when the chassis is closed, e.g., a top or other panel of the chassis is engaged with a body of the chassis. Embodiments assist in reduction of a number of broken DIMM connector latches, solder joint leads that become unsecured from connector housings, and other damage that may occur to the motherboard due to shock and/or vibration.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
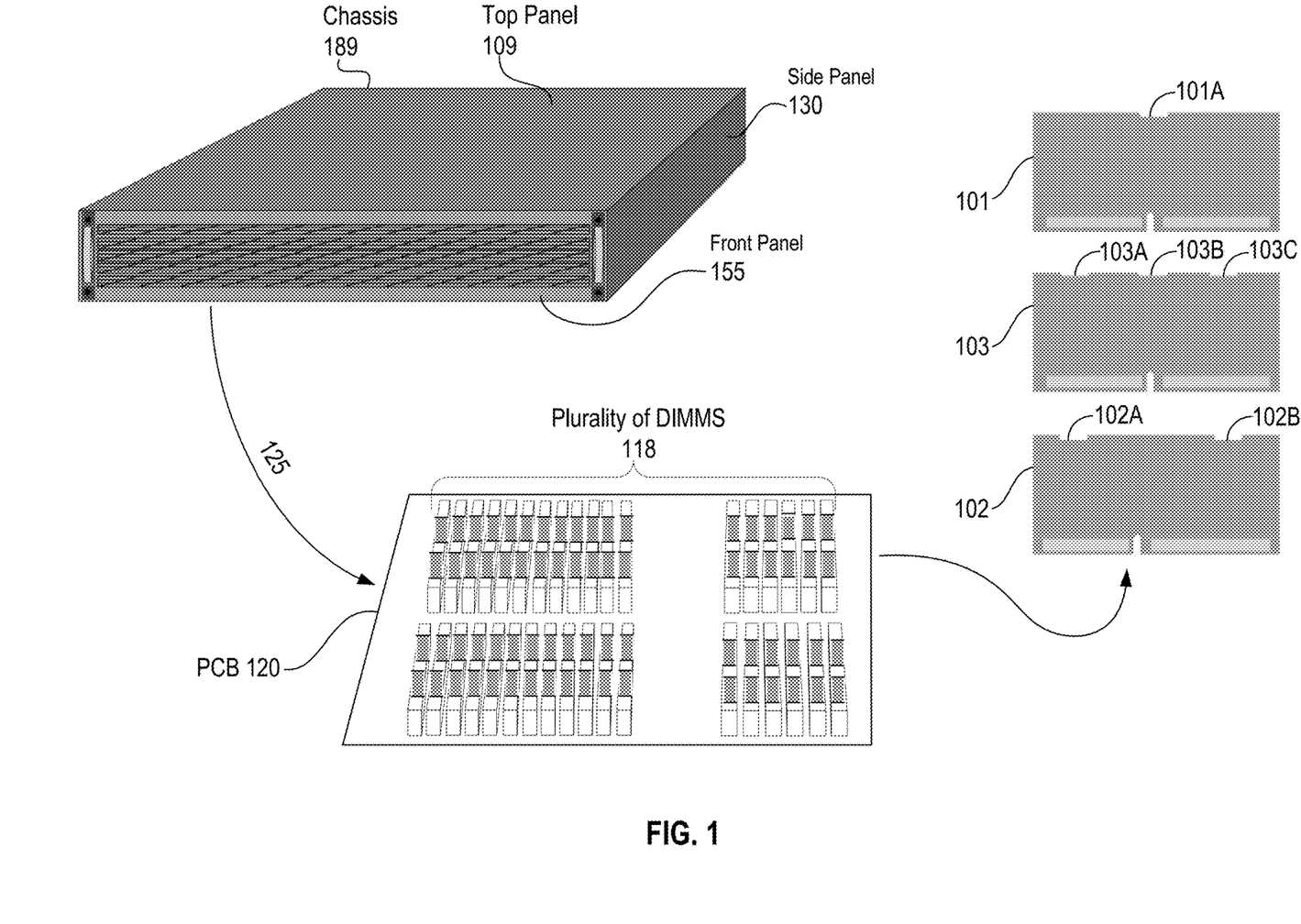
FIG. 1 illustrates an example chassis and a plurality of memory modules, e.g., DIMMs, including one or more notches to assist in retention of the DIMM on a circuit board, in accordance with embodiments of the present disclosure.

FIG. 1 illustrates an example chassis and a plurality of memory modules, e.g., DIMMs, including one or more notches to assist in retention of the DIMM on a circuit board, in accordance with some embodiments of the present disclosure. As illustrated, in FIG. 1, chassis 189 includes a front panel 155, top panel 109, and side panel 130. In some embodiments, chassis 188 may be a 2 U chassis. As noted above, 1 U is a known measure, e.g., 1.75 inches or approximately 1.75 inches, and may correspond to 1 rack unit ("RU" or "U") unit of measure for a height of rack space; and 2 U, 3 U, 4 U, etc. and racks and corresponding equipment (e.g., rackmount servers) may be expressed in multiples of 1 U. Furthermore, note that a chassis or DIMM referenced herein as, e.g., 1 U or 2 U, is of a suitable height to be compatible with a respective, e.g., 1 U or 2 U platform. In some embodiments, chassis 189 is a 2 U chassis. In various embodiments, chassis 189 is a server, memory, communications or any suitable type of chassis to include a plurality of DIMMs removeably coupled to a circuit board, e.g., coupled to a socket or other connector in the circuit board. In various configurations, chassis 189 opens from any suitable one or more panels. For example, in embodiments, chassis 189 may open or partially open from the top panel or bottom panel.

As arrow 125 indicates, chassis 189 holds a circuit board 120, e.g., a motherboard, on which a plurality of DIMMS 118 are removeably coupled. In embodiments, each of the plurality of DIMMS may include one or more notches (e.g., keep-out areas, cut-outs, or the like) located along a top edge to assist in retention of the DIMM on circuit board 120. As illustrated, in one embodiment, a DIMM 101 includes a single notch 101A. In another embodiment, a DIMM 102 includes two notches, e.g., a first notch 102A and a second notch 102B, while in another embodiments, a DIMM 103 includes three notches, e.g., a first notch 103A, second notch 103B, and third notch 103C. In embodiments, the one or more notches on the DIMMs are to removeably couple with one or more flexible supports to be located at least partially along a length or width of a chassis and to engage the one or more notches to assist in retention of the DIMM to reduce a shock and/or vibration load of a plurality of DIMMs on the circuit board in the chassis.

Although, the DIMMS shown in FIG. 1 include from one to three notches, in various embodiments, there may be any number of notches in any location along the DIMM suitable to removeably couple with one or more flexible supports to be discussed further below. In embodiments, DIMMS 101, 102, 103, or any other DIMM of plurality of DIMM 118 may be of any suitable size or height that may benefit from one or more notches that assist in retention of the DIMM on a circuit board. In some embodiments, the DIMM is a double data rate (DDR) synchronous random-access memory (DDR SRAM) DIMM. In some embodiments the DIMM is a circuit board, e.g., printed circuit board (PCB) that includes one or more of any suitable type of DRAM integrated circuits, memory controllers, cache, 3D XPOINT™ and as noted further below, other types of memory associated with Intel® Optane™ technologies. In some embodiments, the DIMM is a DIMM associated with an APACHE PASS™ platform DIMM. As seen from the FIGS, the one or more notches are cut from the PCB portion of the DIMM. In embodiments, DIMM 200 has a height (h) greater than a 1 U DIMM that is compatible with a 1 U chassis. As noted above, in embodiments, DIMM 200 may be compatible with a 2 U chassis.

Note that in some embodiments, each of plurality of DIMMS 118 may be coupled with circuit board 120, via DIMM latch connectors (not shown). Furthermore, circuit board 120 may be a printed circuit board (PCB) composed of an electrically insulative material such as an epoxy laminate. For example, the circuit board 120 may include electrically insulating layers composed of materials that may be laminated together. Interconnect structures (not shown) such as traces, trenches, or vias may be formed through the electrically insulating layers to route the electrical signals of the plurality of DIMMS 118 through the circuit board 120. The circuit board 120 may be composed of other suitable materials in other embodiments. In some embodiments, the circuit board 120 may be a motherboard and may be included in a computing device, such as, for example, server, personal computer, workstation, or consumer device. Note that in FIG. 1, only plurality of DIMMS 118 are shown as coupled to circuit board 120 in order not to obscure the embodiments. In embodiments, circuit board 120 may include various elements associated with the computer device shown and discussed with respect to FIG. 6.

Figure 2:
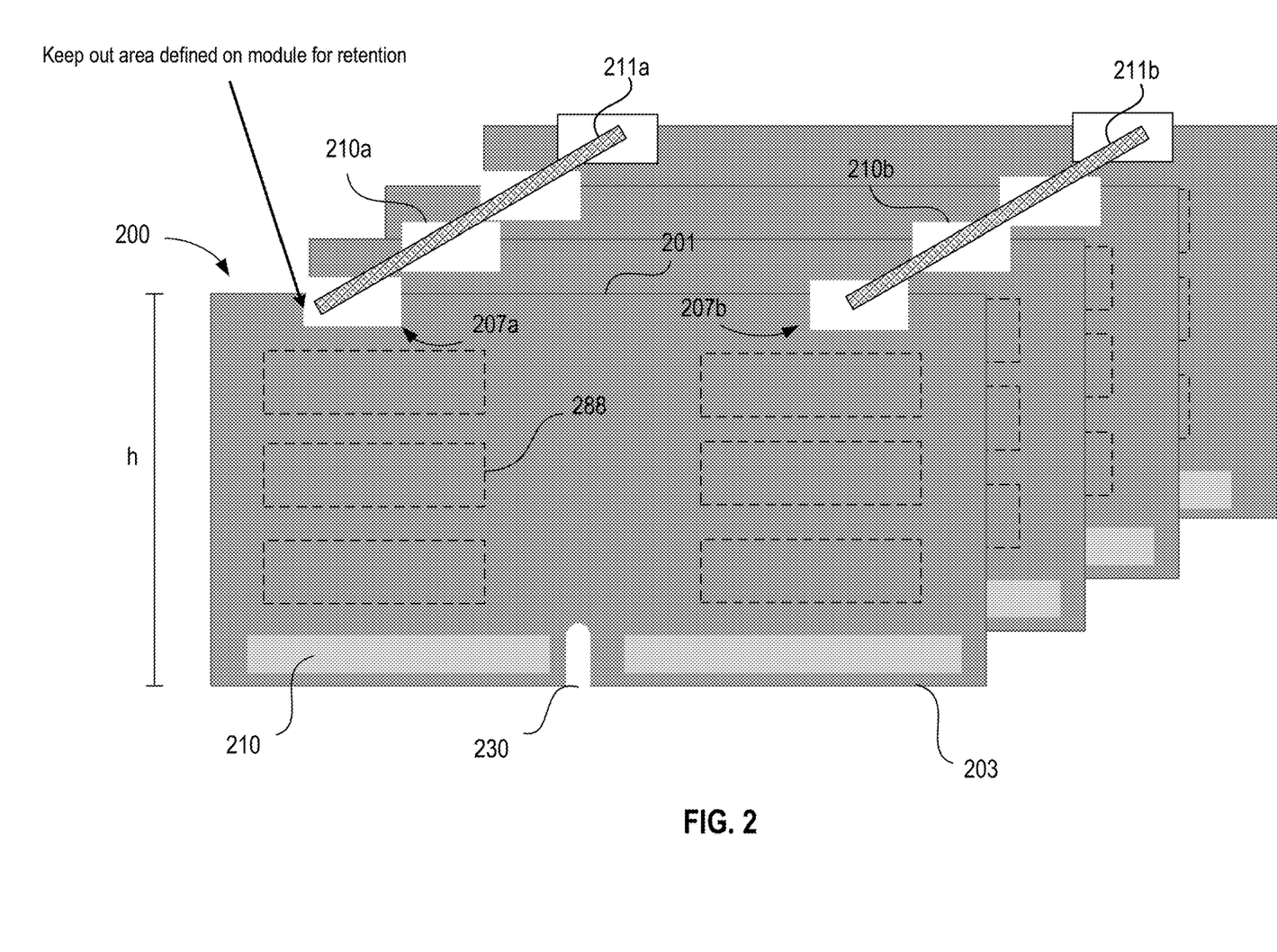
FIG. 2 illustrates a perspective view of a plurality of example memory modules, e.g., DIMMs, in accordance with embodiments of the present disclosure.

Referring now to FIG. 2, which illustrates a perspective view of a plurality of example memory modules, e.g., DIMMs, in accordance with embodiments of the present disclosure. As shown, DIMM 200 (which may be similar or the same as, e.g., DIMM 102 of FIG. 1) includes a first or a top lengthwise edge 201 (also "top edge 201") and a second lengthwise edge or a bottom lengthwise edge 203 (also "bottom edge 203"). Note that the plurality of memory modules are similar to DIMM 200 and include similar elements, which may or may not be labeled for clarity in the FIGS. In embodiments, bottom lengthwise edge 203 includes electrical contacts 210, module notch 230, and removeably couples DIMM 200 with a circuit board (also sometimes referred to herein as printed circuit board or PCB). In embodiments, top lengthwise edge 201 includes one or more cut-outs or notches 207, e.g., a first notch 207a and a second notch 207b, to removeably couple with a corresponding one or more flexible supports 210a and 210b (also shown and discussed further below with respect to FIGS. 3-5) to reduce a shock and/or vibration load of DIMM 200 when included in a plurality of DIMMS on the circuit board. Note that one or more flexible supports 210a and 210b are mounted or otherwise coupled to respective pole(s) 211a and 211b coupled along a chassis panel (not shown). Note as shown with respect to FIG. 1, that although two notches are shown on top edge 201 of DIMM 200, embodiments include a fewer or a higher number of notches (e.g., DIMM 101, 103, of FIG. 1 or other suitable DIMM with a suitable number of notches for support). Furthermore, in embodiments, the number of notches corresponds to a number of poles or supporting structures (as is also discussed further with respect to FIG. 3). For example, in FIG. 2, DIMM 200 includes two notches (207a and 207b) that removeably couple with two respective flexible supports (210a and 210b), and in turn with two poles (211a and 211b). In other embodiments, a DIMM with one notch (e.g., 101 of FIG. 1) would removeably couple with a respective one flexible support and one pole. Furthermore, a DIMM with three notches (e.g., 103 of FIG. 1) would removeably couple with a respective three flexible supports and three poles.

Figure 3:
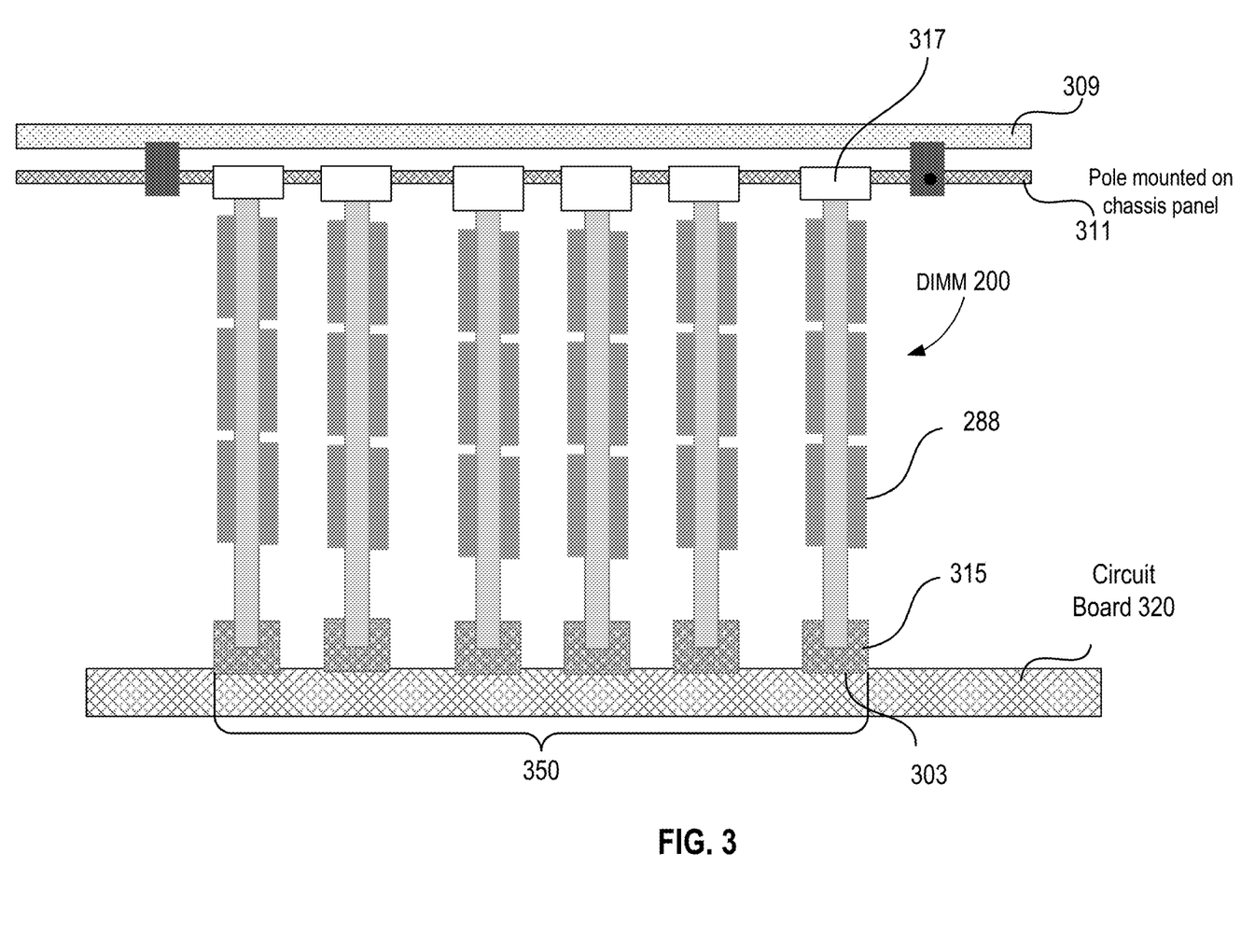
FIG. 3 illustrates a side view of an example plurality of DIMMs removeably coupled to one or more flexible supports, in accordance with embodiments of the present disclosure.

Further, note that as shown, DIMM 200 includes a plurality of electrical components that may include, e.g., one or more memory units 288, mounted to or otherwise attached to DIMM 200. In some embodiments, memory units 288 are mounted on only one side of DIMM 200. In other embodiments, (e.g., as can be seen in FIG. 3) memory units 288 may be mounted on both sides of DIMM 200. In some embodiments, the DIMM is a double data rate (DDR) synchronous random-access memory (DDR SRAM) DIMM and the memory units include RAM modules or chips. In some embodiments, the DIMM is a non-volatile DIMM (NV DIMM). In some embodiments, the DIMM may include one or more memory units that include a cross-point memory array or phase-change memory device. In embodiments, the one or more memory units include cross-point or phase-change integrated circuits. In other embodiments, the memory units include NAND memory such as, e.g., JEDEC NVDIMM-N, JEDEC NVDIMM-P, and the like.

In embodiments, DIMM 200 includes any suitable type of memory unit 288 that may be mounted or otherwise attached to DIMM 200, where DIMM 200 may benefit from one or more notches that assist in retention of the DIMM on a circuit board. Accordingly, memory units 288 are shown merely as an example, and a number and configuration of the memory units may vary significantly across various DIMMs. In some embodiments, DIMM 200 includes only a single memory unit 288. In addition, in order not to obscure the FIGURES, various additional components on the DIMM may have been omitted. Furthermore, note that module notch 230 on a bottom edge of DIMM 200 is merely for illustrative purposes, as various types of DIMMS may omit the module notch or have a different number and position of module notches based on the type of memory module.

Referring now to FIG. 3, which illustrates a side view of an example plurality of DIMMs removeably coupled to one or more flexible supports, in accordance with embodiments of the present disclosure. In embodiments, each of the plurality includes, e.g., a DIMM 200 similar to as described in connection with FIG. 2. In embodiments, each DIMM 200 includes one or more memory units 288 (e.g., a DRAM or other memory chip) disposed on one or both sides of DIMM 200. In embodiments, each DIMM 200 of the plurality is coupled at bottom lengthwise edge 303 at each of a plurality of connectors 315 to a circuit board 320. In embodiments, the one or more notches 207 (e.g., 207a or 207b of FIG. 2) of top edge 201 of DIMM 200 couple with one or more corresponding flexible supports 317 to reduce a shock load of DIMM 200 on circuit board 320.

As shown, one or more flexible supports 317 are mounted or otherwise coupled to a supporting structure that includes one or more poles 311 coupled along a chassis panel 309. In embodiments, pole 311 is attached, mounted, or otherwise coupled to chassis panel 309 assist in absorbing a shock and/or vibration load associated with the plurality of DIMMs coupled to circuit board 320. Note that in embodiments, chassis panel 309 is a top panel and when the chassis is closed and the top panel is coupled to the body of the chassis, the one or more notches contact or otherwise engage one or more flexible supports 317. Thus, in embodiments, one or more notches 207 (e.g., 207a and 207b) of FIG. 2 are located on DIMM 200 to align with one or more flexible supports 317 located along pole 311.

Note that in embodiments, pole 311 is a first pole of a pair of poles. In embodiments, a second parallel pole is disposed along chassis panel 309 directly behind the first pole 311 (and accordingly is obscured by first pole or pole 311). In embodiments, first pole 311 may align with a corresponding first notch 207a and the second parallel pole may align with second notch 207b. In embodiments, a number of the one or more poles corresponds to a number of notches along top edge, e.g., top edge 201, of DIMM 200.

In embodiments, one or more flexible supports 317 is made of, or includes at least in part, rubber or other suitable shock absorbing material to dampen or absorb a shock load resulting from the weight of plurality of DIMMs 350 coupled to circuit board 320. In embodiments, one or more corresponding flexible supports 317 deform to substantially fill the one or more notches 207 of DIMM 200. Note that in FIG. 3, various elements have only been labeled once, in order not to obscure the FIG. 3 (e.g., only one DIMM 200 and one flexible support 317 have been labeled).

Figure 4:
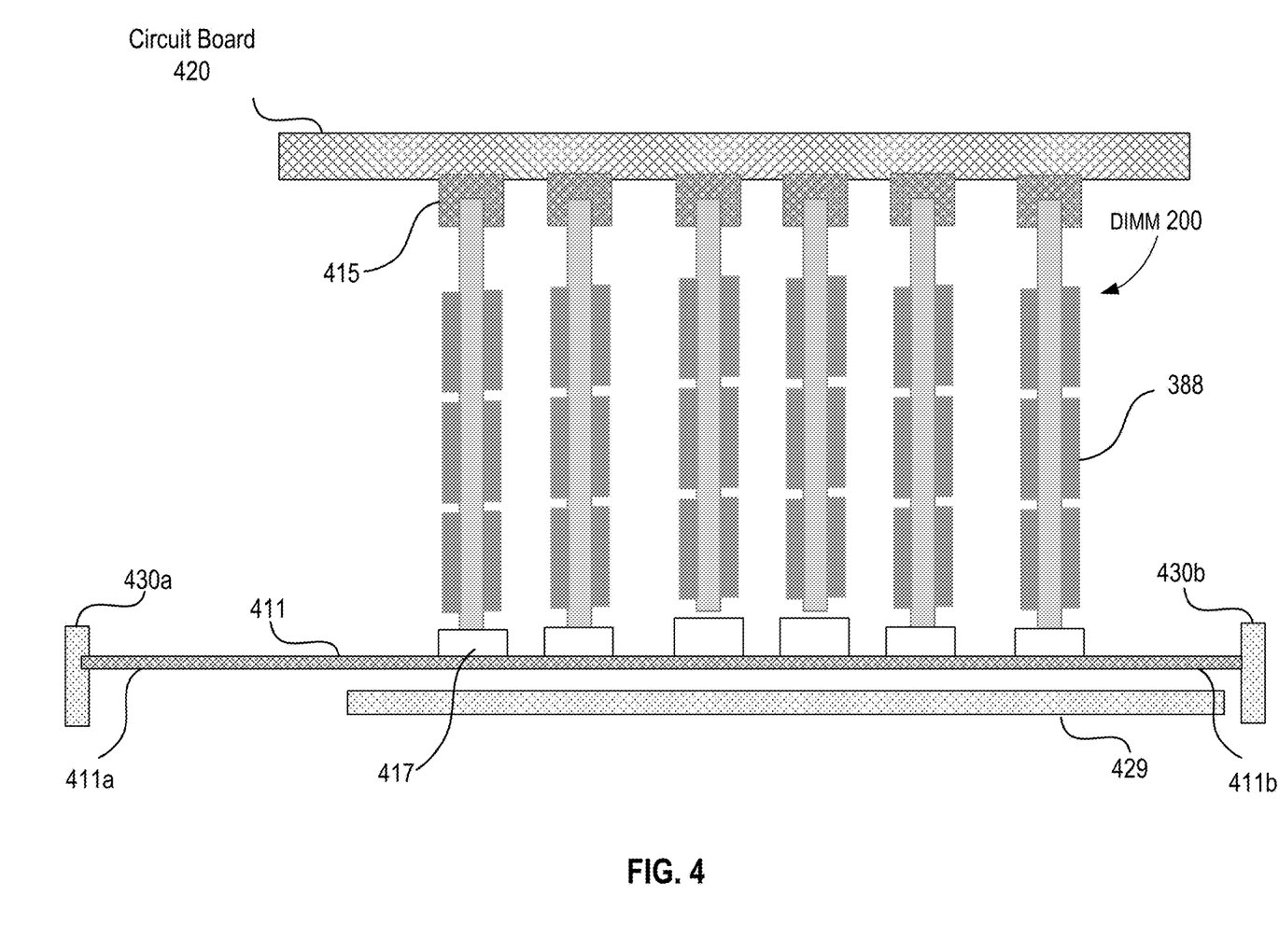
FIG. 4 illustrates a side view of another example plurality of DIMMs removeably coupled to one or more flexible supports, in accordance with embodiments of the present disclosure.

Referring now to FIG. 4 which illustrates another example plurality of DIMMs removeably coupled to one or more flexible supports, in accordance with another embodiment of the present disclosure. In embodiments, circuit board 420 is inverted and configured to be located at a top of a chassis rather than a bottom. In embodiments, each of the plurality includes a DIMM 200 including a memory unit 388, as described in connection with FIG. 3. In embodiments, each DIMM 200 is coupled at each of a plurality of connectors 415 to circuit board 420 towards a top of FIG. 4. In embodiments, support structure or pole 411 is located proximate to a bottom chassis panel 429. In embodiments, a first end 411a and a second end 411b of pole 411 are attached, mounted, or otherwise coupled to respective first chassis side panel 430a and second chassis side panel 430b.

Note that in embodiments, one or more flexible supports 417 are mounted or otherwise coupled to pole 411. Accordingly, in embodiments, each DIMM 200 of the plurality is coupled at one or more notches (obscured in this FIG. but as shown in, e.g., 207a or 207b of FIG. 2) to a corresponding one or more flexible supports 417. Note that in embodiments, attaching pole 411 to first and second side panels 430a and 430b, rather than, e.g., bottom panel 529, avoids stress on bottom panel 529 and in some cases, allows bottom panel 529 to be removed without disturbing one or more of DIMMs 200.

Figure 5:
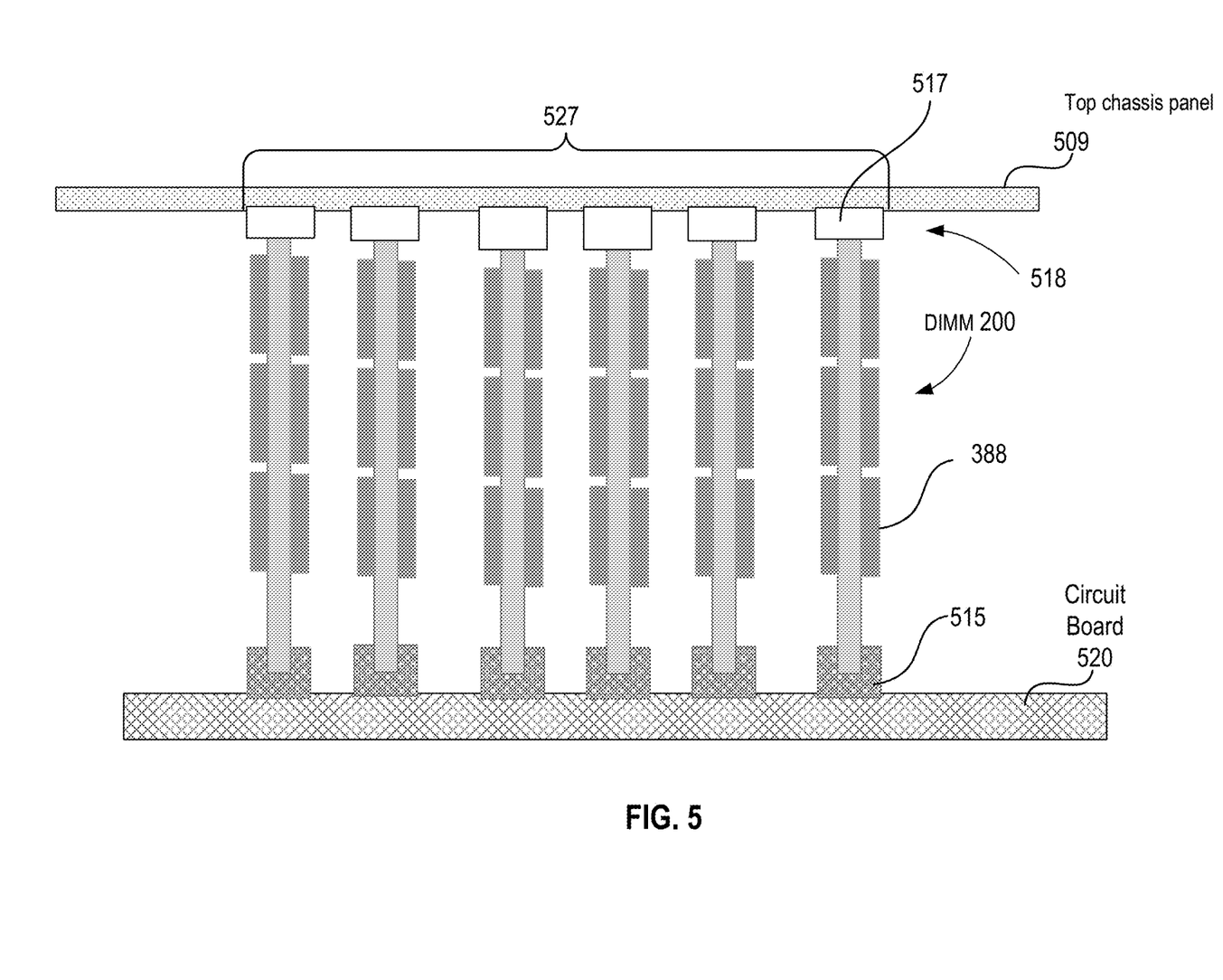
FIG. 5 illustrates a side view of another example plurality of DIMMs removeably coupled to one or more flexible supports, in accordance with embodiments of the present disclosure.

Referring now to FIG. 5 which illustrates another example plurality of DIMMs removeably coupled to one or more flexible supports, in accordance with another embodiment of the present disclosure. Similar to, e.g., FIG. 3, in embodiments, each DIMM 200 of the plurality is coupled at bottom lengthwise edge 203 at each of a plurality of connectors 515 to a circuit board 520. In embodiments, DIMM 200 includes a memory unit 388 on one or both sides of DIMM 200. In FIG. 5, one or more flexible supports 517 ("flexible support(s) 517") are mounted or otherwise coupled directly to a top chassis panel 509 rather than coupled to a first or second pole or additional support structure as in previous FIGS. In embodiments, when the chassis (e.g., as shown above in FIG. 1) is closed and top panel 509 is engaged or coupled to the body of the chassis, one or more notches 207 (207*a* and 207*b*, as shown in FIG. 2) of DIMM 200 contact or otherwise engage one or more corresponding flexible supports 517. Note that in FIG. 5, flexible supports 517 obscure the view of notches 207.

Thus, in embodiments, one or more notches 207 are located on DIMM 200 to align with one or more flexible supports 517. Note that in embodiments, plurality of flexible supports 527 that include one or more flexible supports 517 shown in the side view of FIG. 5 may represent a first row of flexible supports that align with, e.g., a first row of notches (e.g., a first notch 207*a*) on a plurality of DIMMs 200. In embodiments, a second parallel row of flexible supports aligns with, e.g., a second row of notches (e.g., a second notch 207*b*) of the plurality of DIMMs 200. In embodiments, the second row is disposed along top chassis panel 509 directly behind the first row 518 and accordingly is obscured by first row 518.

Figure 6:
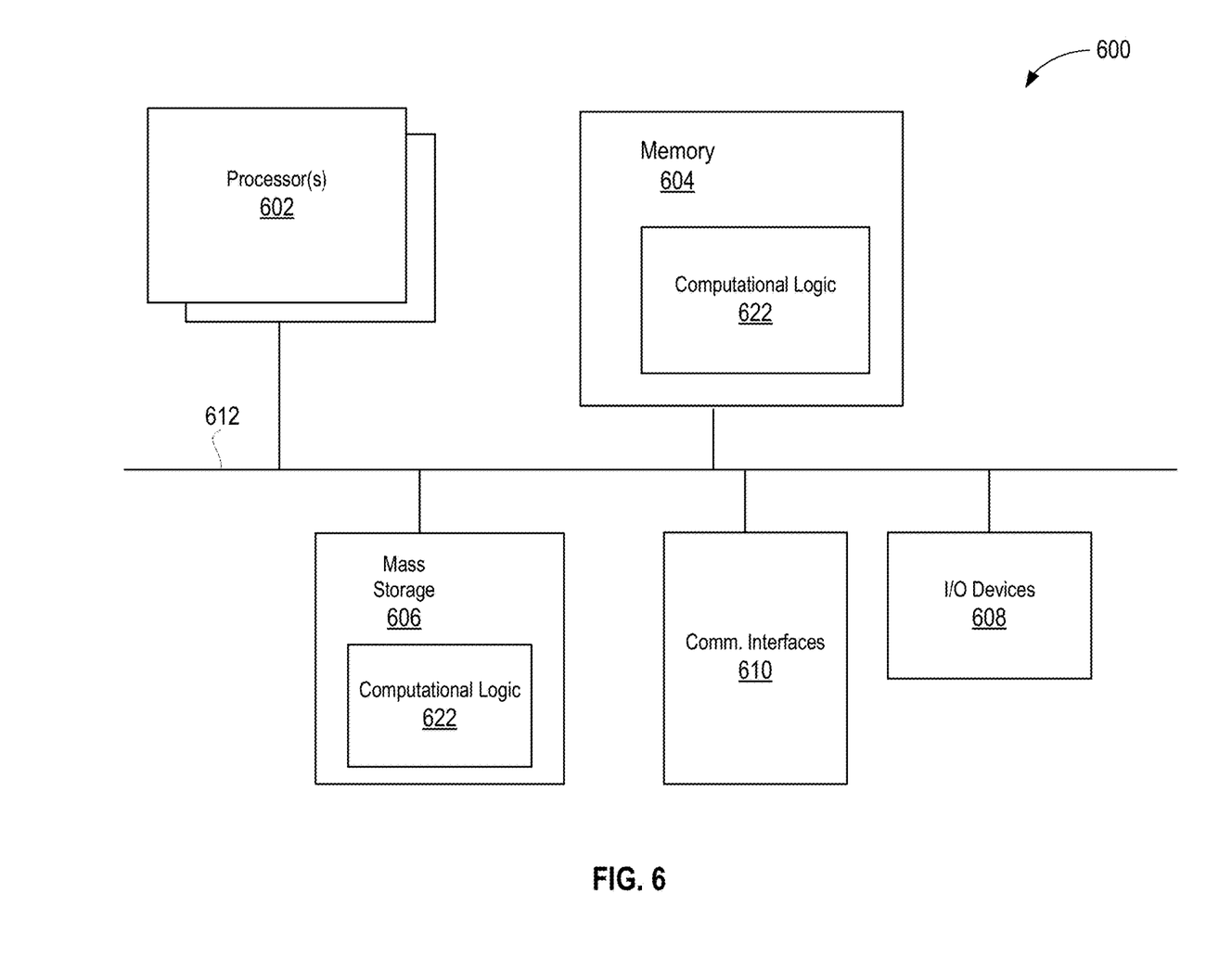
FIG. 6 is a schematic of a computing system, in accordance with embodiments of the present disclosure.

FIG. 6 illustrates an example electronic device 600 (e.g., a computer, a server, or some other electronic device) that may be suitable to practice selected aspects of the present disclosure. As shown, electronic device 600 may include one or more processors or processor cores 602. For the purpose of this application, including the claims, the term "processors" refers to physical processors, and the terms "processor" and "processor cores" may be considered synonymous, unless the context clearly requires otherwise. The electronic device 600 may include one or more memories 604, which may include one more DIMMs as described herein, e.g., the DIMMs of FIGS. 1-5. In embodiments, the one or more DIMMS may include one or more notches located along the first lengthwise edge, to removeably couple with one or more flexible supports to be located at least partially along a length or width of a chassis and to engage the one or more notches to assist in retention of the DIMM in a chassis to reduce a shock and/or vibration associated with a load of a plurality of DIMMs on a circuit board or PCB. In embodiments, one or more DIMMs includes one or more a phase-change memory devices mounted on the DIMM.

In embodiments, a memory device mounted on the DIMM includes an NVM device, e.g., a byte-addressable write-in-place three dimensional crosspoint memory device, or other byte addressable write-in-place NVM devices (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

In embodiments, DIMM is a double data rate (DDR) DIMM and/or the RAM components include a memory unit or medium including a cross-point memory array.

Note that a memory subsystem as described herein may be compatible with a number of memory technologies, such as DDR3 (Double Data Rate version 3, original release by JEDEC (Joint Electronic Device Engineering Council) on Jun. 27, 2007), DDR4 (DDR version 4, initial specification published in September 2012 by JEDEC), DDR4E (DDR version 4), LPDDR3 (Low Power DDR version 3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014), HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications.

In some embodiments, electronic device 600 is enclosed in the chassis, e.g., chassis 189, and including one or more panels and/or supporting structure (pole 311 or 411) as described in connection with FIGS. 3-5.

Additionally, electronic device 600 may include mass storage devices 606 (such as diskette, hard drive, compact disc read-only memory (CD-ROM) and so forth), input/output (I/O) devices 608 (such as display, keyboard, cursor control and so forth) and communication interfaces 610 (such as network interface cards, modems and so forth). The elements may be coupled to each other via system bus 612, which may represent one or more buses. In the case of multiple buses, they may be bridged by one or more bus bridges (not shown). Each of these elements may perform its conventional functions known in the art. In particular, in some embodiments, memory 604 and mass storage devices 606 may be employed to store a working copy and a permanent copy of the programming instructions configured to perform one or more processes or memory/storage transactions for the electronic device 600. The programming instructions may be collectively referred to as controller logic 622. The various elements may be implemented by assembler instructions supported by processor(s) 602 or high-level languages, such as, for example, C, that can be compiled into such instructions.

The number, capability and/or capacity of the elements shown in FIG. 6 may vary, depending on whether electronic device 600 is used as a server, communication device, or some other type of computing device. When used as a server device, the capability and/or capacity of the elements shown in FIG. 6 may also vary, depending on whether the server is a single stand-alone server or a configured rack of servers or a configured rack of server elements.

Otherwise, the constitutions of the elements shown in FIG. 6 may be known, and accordingly will not be further described.

The terminology used herein is for the purpose of describing particular embodiments only and is not intended to be limiting of the disclosure. As used herein, the singular forms "a," "an" and "the" are intended to include plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Thus various example embodiments of the present disclosure have been described including, but not limited to:

Example 1 may include a dual in-line memory module (DIMM), comprising: a first lengthwise edge along the DIMM; a second lengthwise edge, opposite the first lengthwise edge, to removeably couple the DIMM with a printed circuit board (PCB); and one or more notches located along the first lengthwise edge, to removeably couple with one or more corresponding supports to be located at least partially along a length or width of a chassis and to engage the one or more notches to assist in retention of the DIMM in the chassis to reduce a shock or vibration associated with a load of the DIMM included in a plurality of DIMMs on the PCB.

Example 2 may include the DIMM of Example 1, wherein the DIMM comprises a double data rate (DDR) synchronous random-access memory (DDR SRAM) DIMM.

Example 3 may include the DIMM of Example 1, wherein the DIMM has a height greater than one rack unit (1 U) or a height of a 1 U DIMM.

Example 4 may include the DIMM of Example 1, wherein the one or more supports are flexible and the one or more notches are to contact the one or more corresponding flexible supports when a top panel of the chassis is engaged with a body of the chassis.

Example 5 may include the DIMM of Example 1, wherein the one or more notches are to align with the one or more corresponding supports and the supports are to couple to a structure located along the length or width of the chassis.

Example 6 may include the DIMM of Example 5, wherein the one or more notches are to couple to the one or more corresponding supports and the supports are to deform to substantially fill the one or more notches.

Example 7 may include the DIMM of Example 6, wherein the structure includes one or more poles coupled along a top panel of the chassis.

Example 8 may include the DIMM of any one of Examples 1-7, wherein a number of the one or more poles corresponds to a number of notches in the DIMM.

Example 9 may include an apparatus, comprising: one or more supports; and a pole coupled to the one or more supports, wherein the one or more supports are located at least partially along a length of the pole and the pole is to be coupled to a chassis panel to removeably couple the one or more supports with one or more notches of a first lengthwise edge of a dual in-line memory module (DIMM), to absorb a shock or vibration load associated with the DIMM when the DIMM is coupled at a second lengthwise edge, opposite to the first lengthwise edge, to a printed circuit board (PCB) in a chassis including the chassis panel.

Example 10 may include the apparatus of Example 9, wherein the one or more supports comprise a shock absorbing material to dampen or absorb the shock or vibration load.

Example 11 may include the apparatus of Example 9, wherein the one or more supports are to deform to substantially fill the one or more notches of the DIMM.

Example 12 may include the apparatus of Example 9, wherein the chassis panel is a top chassis panel.

Example 13 may include the apparatus of any one of Examples 9-12, further comprising the chassis and wherein the chassis comprises a two rack unit (2 U) server chassis.

Example 14 may include a system, comprising: a dual in-line memory module (DIMM), including a first lengthwise edge and a second lengthwise edge opposite the first lengthwise edge; one or more notches located along the first lengthwise edge, to removeably couple with one or more supports located at least partially along a length or width of a chassis; and a printed circuit board (PCB) coupled to the DIMM at the second lengthwise edge, wherein the DIMM is to be removeably coupled to the one or more supports at the first lengthwise edge to reduce a shock and/or vibration load associated with the DIMM on the PCB when enclosed in the chassis.

Example 15 may include the system of Example 14, further comprising the chassis, wherein the chassis includes a top chassis panel coupled to the one or more supports.

Example 16 may include the system of Example 15, wherein the one or more notches are to align with the one or more supports and the one or more supports are to couple to a structure located along the length or width of the chassis.

Example 17 may include the system of Example 16, wherein the structure comprises a pole mounted to the top chassis panel.

Example 18 may include the system of Example 16, wherein the one or more supports are flexible and are to deform to substantially fill the one or more notches of the DIMM.

Example 19 may include the system of Example 17, wherein the DIMM is included in a plurality of double data rate (DDR) synchronous random-access memory (DDR SRAM) DIMMs having a height greater than a 1 U DIMM and removeably coupled to the PCB.

Example 20 may include the system of Example 14, wherein the DIMM includes byte-addressable persistent memory devices mounted on a circuit board of the DIMM.

Example 21 may include the system of any one of Examples 14-20, wherein the chassis has a height of a 2 U chassis.

Example 22 may include a memory module, comprising: a memory board; a plurality of RAM memory components coupled to a surface of the memory board; a first lengthwise edge along the memory board, to removeably couple the memory board with a motherboard; a second lengthwise edge, opposite the first lengthwise edge; and one or more notches located along the second lengthwise edge, to removeably couple with one or more flexible supports located at least partially along a length or width of a chassis to enclose the motherboard and the memory board, the one or more flexible supports to reduce a shock load of the memory board on the motherboard.

Example 23 may include the memory module of Example 23 wherein the memory module is a DIMM.

Example 24 may include the memory module of Examples 22-23, wherein the DIMM is a double data rate (DDR) DIMM and the RAM components include a memory medium including a cross-point memory array.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. A dual in-line memory module (DIMM), comprising:
a first lengthwise edge along the DIMM;
a second lengthwise edge, opposite the first lengthwise edge, to removeably couple the DIMM with a printed circuit board (PCB); and
a first notch and a second notch located along the first lengthwise edge, wherein each of the first notch and the second notch removeably couple to each of a corresponding respective first flexible support and second flexible support, wherein each of the corresponding respective first flexible support and second flexible support are to couple to and along a structure that runs in a longitudinal direction along one of a length or width of a chassis and wherein the longitudinal direction is substantially perpendicular to a plane of the DIMM along which at least one memory unit is mounted; and
wherein the DIMM is a 2 U DIMM and wherein the first flexible support and the second flexible support are aligned to engage the first notch and the second notch to assist in retention of the DIMM in the chassis to reduce a shock or vibration associated with a load of the DIMM on the PCB.

2. The DIMM of claim 1, wherein the DIMM comprises a double data rate (DDR) synchronous random-access memory (DDR SRAM) DIMM.

3. The DIMM of claim 1, wherein the first notch and the second notch are to contact the corresponding respective first flexible support and second flexible support supports when a top panel of the chassis is engaged with a body of the chassis.

4. The DIMM of claim 1, wherein the first notch and the second notch are to couple to the one or more corresponding first flexible support and second flexible support and the supports are to deform to substantially fill the first notch and the second notch.

5. A system, comprising:
a dual in-line memory module (DIMM), including:
a first lengthwise edge and a second lengthwise edge opposite the first lengthwise edge;
a first notch and a second notch located along the first lengthwise edge, wherein each of the first notch and the second notch removeably couple to each of a corresponding respective first flexible support and a second flexible support, wherein each of the corresponding respective first flexible support and second flexible support are to couple to and along a structure that runs in a longitudinal direction along one of a length or width of a chassis and wherein the longitudinal direction is substantially perpendicular to a plane of the DIMM along which at least one memory unit is mounted; and
a printed circuit board (PCB) coupled to the DIMM at the second lengthwise edge, wherein the DIMM is a 2 U DIMM and is to be removeably coupled to the first flexible support and the second flexible support aligned to engage the respective first notch and second notch at the first lengthwise edge to reduce a shock and/or vibration load associated with the DIMM on the PCB when enclosed in the chassis.

6. The system of claim 5, further comprising the chassis, wherein the chassis includes a top chassis panel coupled to the first flexible support and the second flexible support.

7. The system of claim 5, wherein the first flexible support and the second flexible support deform to substantially fill the respective first notch and the second notch of the DIMM.

8. The system of claim 5, wherein the DIMM is included in a plurality of double data rate (DDR) synchronous random-access memory (DDR SRAM) DIMMs having a height greater than a 1 U DIMM and removeably coupled to the PCB.

9. The system of claim 5, wherein the DIMM includes one or more byte-addressable persistent memory devices mounted on a circuit board of the DIMM.

* * * * *

UNITED STATES PATENT AND TRADEMARK OFFICE
CERTIFICATE OF CORRECTION

PATENT NO. : 10,888,010 B2
APPLICATION NO. : 16/422854
DATED : January 5, 2021
INVENTOR(S) : George Vergis, Phil Geng and Xiang Li It is certified that error appears in the above-identified patent and that said Letters Patent is hereby corrected as shown below:

In the Claims

Column 11,
Line 33, Claim 3, "... support supports" should read -- ... support --

Signed and Sealed this
Twenty-first Day of February, 2023

Katherine Kelly Vidal
*Director of the United States Patent and Trademark Office*